(12) United States Patent
Chevallier

(10) Patent No.: US 6,845,053 B2
(45) Date of Patent: Jan. 18, 2005

(54) POWER THROUGHPUT ADJUSTMENT IN FLASH MEMORY

(75) Inventor: Christophe J. Chevallier, Palo Alto, CA (US)

(73) Assignee: Micron Technology, Inc., Boise, ID (US)

(*) Notice: Subject to any disclaimer, the term of this patent is extended or adjusted under 35 U.S.C. 154(b) by 59 days.

(21) Appl. No.: 10/295,653

(22) Filed: Nov. 15, 2002

(65) Prior Publication Data

US 2004/0095834 A1 May 20, 2004

(51) Int. Cl.$^7$ ................................................. G11C 7/00
(52) U.S. Cl. ............. 365/226; 365/189.01; 365/189.04; 365/189.12
(58) Field of Search ........................... 365/226, 189.01, 365/189.04, 189.12

(56) References Cited

U.S. PATENT DOCUMENTS

| | | | |
|---|---|---|---|
| 4,507,760 A | * | 3/1985 | Fraser ........................ 365/221 |
| 5,537,354 A | | 7/1996 | Mochizuki et al. |
| 6,067,598 A | | 5/2000 | Roohparvar et al. |
| 6,469,932 B2 | * | 10/2002 | Roohparvar et al. ... 365/185.09 |
| 6,657,900 B2 | * | 12/2003 | Roohparvar ........... 365/185.33 |

* cited by examiner

*Primary Examiner*—Richard Elms
*Assistant Examiner*—Pho M. Luu
(74) *Attorney, Agent, or Firm*—Leffert Jay & Polglaze, P.A.

(57) ABSTRACT

A mode control bit is used to adjust a mode of a memory device. The mode control bit is stored in a non-volatile memory location and selects between a data rate, low power consumption mode and a higher power, fast programming mode. In the low power consumption mode the mode control bit reduces the rate at which data bits are programmed into the memory device.

29 Claims, 5 Drawing Sheets

POWER THROUGHPUT ADJUSTMENT IN FLASH MEMORY

BACKGROUND OF THE INVENTION

I. Field of the Invention

The present invention relates generally to programming flash memory and particularly to throughput adjustment.

II. Description of the Related Art

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

To encompass a large variety of applications, chip designers make some restrictive choices in the characteristics of the memory design. These characteristics include current consumption and programming speed or throughput. The designers typically have to trade off one for the other since the faster the programming, the higher the current consumption. Similarly, the larger the number of bits programmed in parallel, the higher the current consumption.

Battery powered devices would benefit more from low power consumption than higher throughput. Line powered devices would benefit more from programming throughput than low power consumption. In order to satisfy both markets, flash memory designers typically have to design multiple versions of a memory. This requires more time and money on the part of the designer. There is a resulting need in the art for a way to choose power consumption versus throughput in a flash memory device.

SUMMARY

The embodiments of the present invention encompass a memory device that has a plurality of modes including a high data throughput mode and a low power mode. The device is comprised of a non-volatile memory location that stores a mode control bit. The state of the mode control bit selects one of the modes. In one embodiment, the mode control bit controls the rate at which data is programmed into the memory device's memory array, thereby controlling the power consumption.

DETAILED DESCRIPTION

The embodiments of the present invention provide a memory device manufacturer with the ability to design one flash memory device that has a selectable low current consumption (i.e., low power) mode and a high data throughput mode. The mode is selectable by a latch that is programmed to select one of the modes. In one embodiment, this latch is permanently programmed with the desired mode at the time of manufacture.

While the subsequent discussion of the embodiments of the present invention refers to flash memory, any type of memory device that has similar characteristics may be used. For example non-volatile RAM (NOVRAM) or electrically erasable programmable read only memory (EEPROM) may be used.

Figure 1:
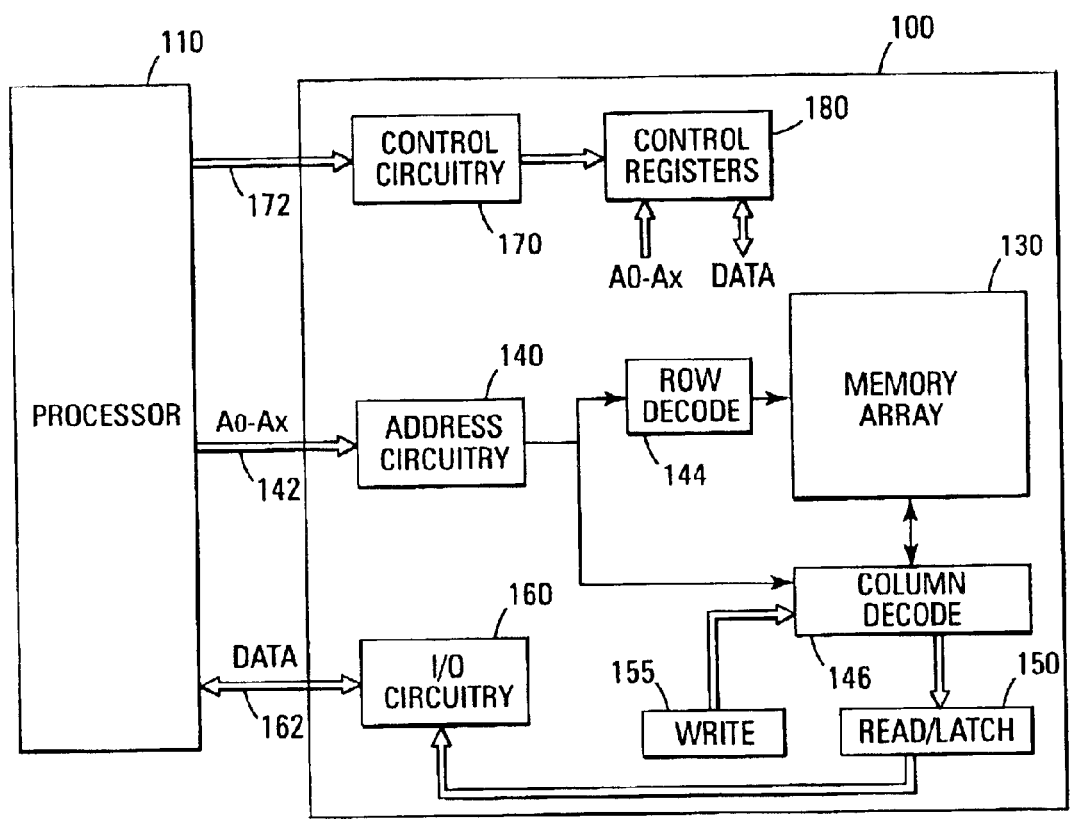
FIG. 1 shows block diagram of one embodiment for a flash memory device incorporating the programmable modes of the present invention.

FIG. 1 is a functional block diagram of a memory device (100) of one embodiment of the present invention that is coupled to a processor (110). The memory device (100) and the processor (110) may form part of an electronic system (120). The processor (110) performs the operational tasks of the electronic system including generating address and control signals for the memory device (100). The memory device (100) has been simplified to focus on features of the memory that are helpful in understanding the present invention.

The memory device includes an array of memory cells (130). The memory cells are non-volatile floating-gate memory cells and the memory array (130) is arranged in banks of rows and columns.

An address buffer circuit (140) is provided to latch address signals provided on address input connections A0-Ax (142). Address signals are received and decoded by a row decoder (144) and a column decoder (146) to access the memory array (130). It will be appreciated by those skilled in the art, with the benefit of the present description, that the number of address input connections depends on the density and architecture of the memory array (130). That is, the number of addresses increases with both increased memory cell counts and increased bank and block counts.

The memory device (100) reads data in the memory array (130) by sensing voltage or current changes in the memory array columns using sense/latch circuitry (150). The sense/latch circuitry, in one embodiment, is coupled to read and latch a row of data from the memory array (130). Data input and output buffer circuitry (160) is included for bi-directional data communication over a plurality of data (DQ) connections (162) with the processor (110). Write circuitry (155) is provided to write data to the memory array (130).

Figure 2:
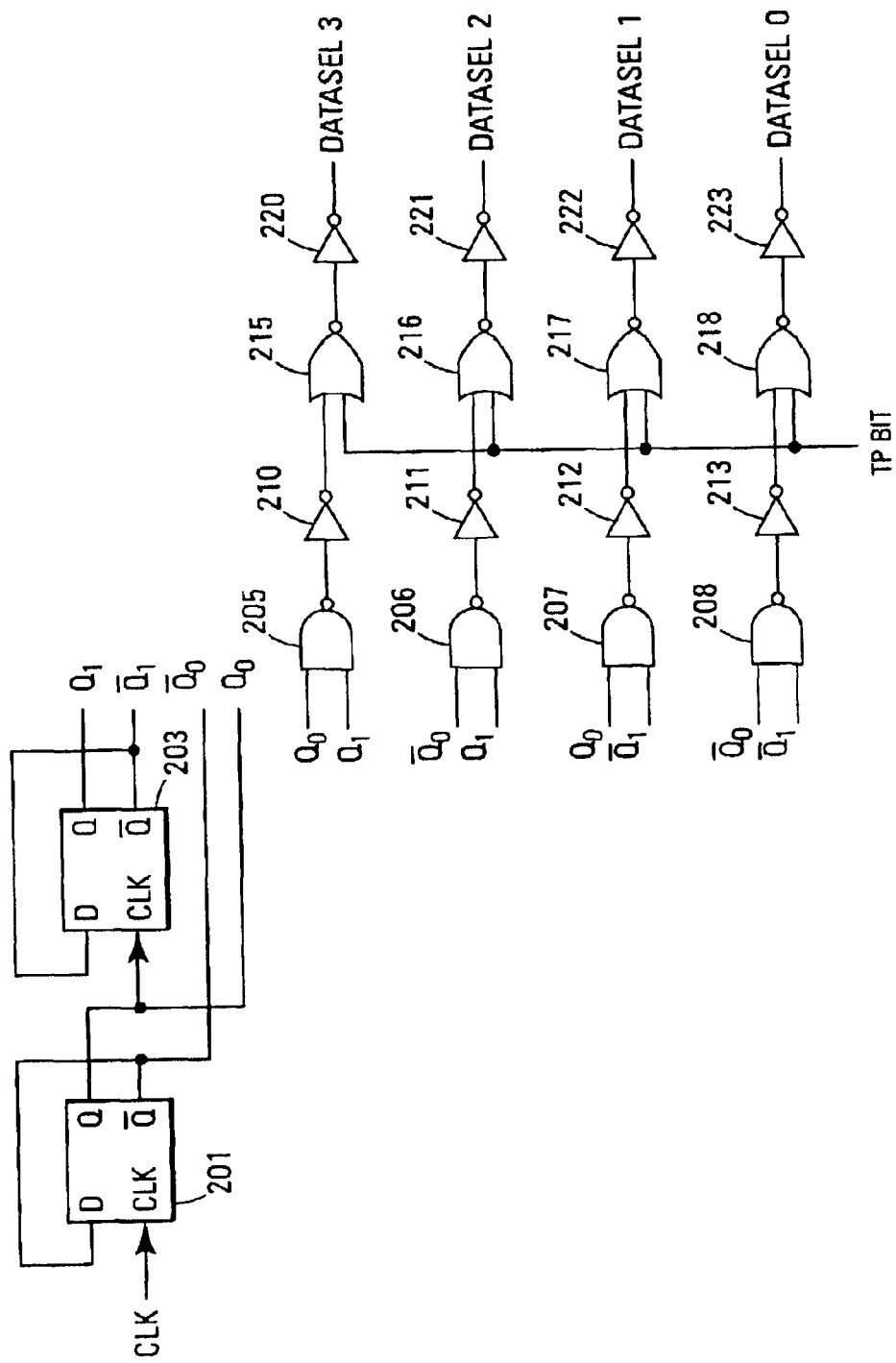
FIG. 2 shows a logic diagram of one embodiment of the mode control programmable element of the present invention.
Figure 3:
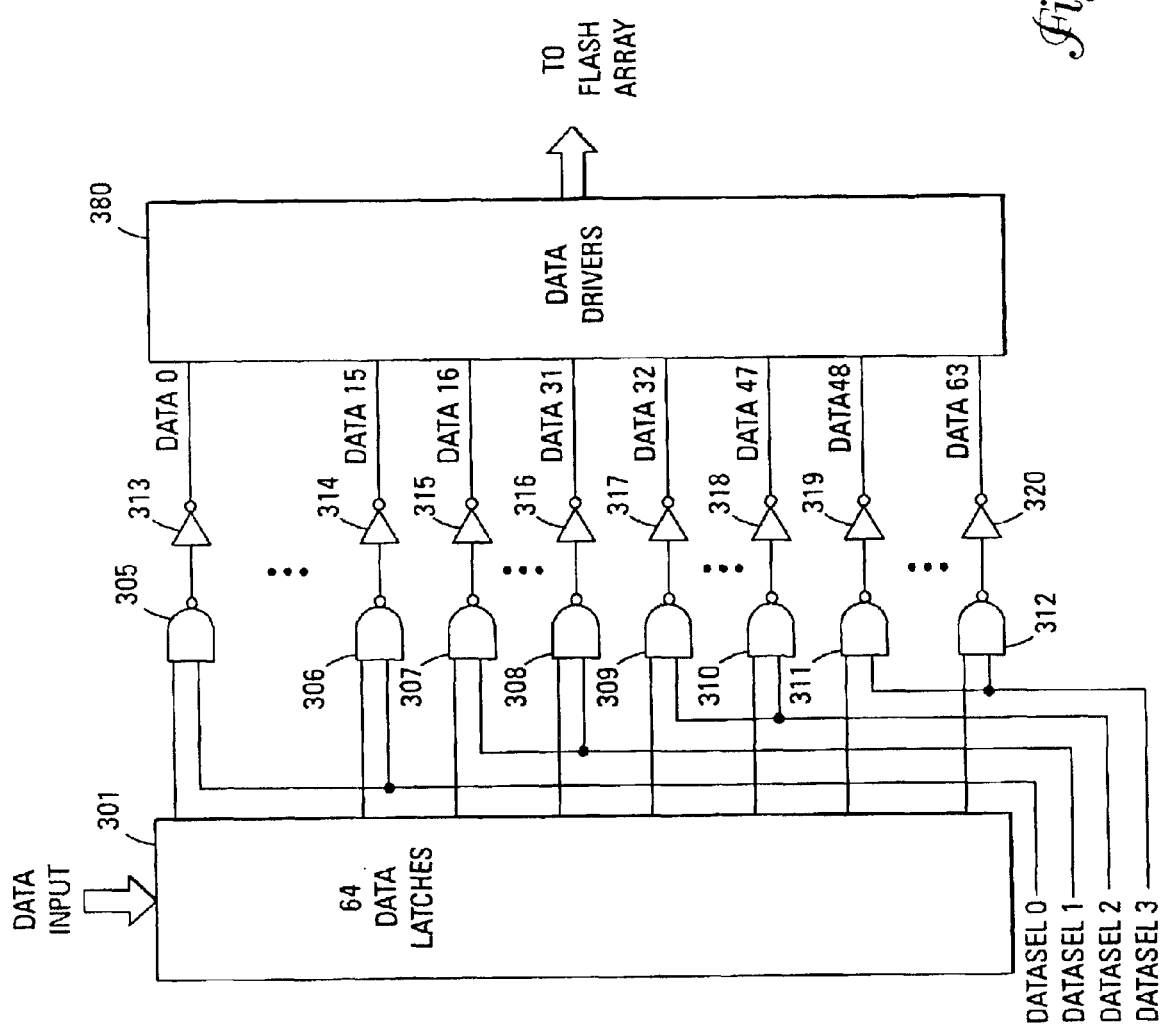
FIG. 3 shows a continuation of the logic diagram of the embodiment of FIG. 2.

The write circuitry (155) may be comprised of any circuitry required to write data to the memory array. FIGS. 2 and 3 illustrate an example of write circuitry that is discussed subsequently in greater detail.

Command control circuit (170) decodes signals provided on control connections (172) from the processor (110). These signals are used to control the operations on the memory array (130), including data read, data write, and erase operations.

An array of control registers (180) store control functions of the present invention. Some of the control registers are used for typical control functions and others are reserved for expansion and/or future use. In one embodiment, at least one address or latch within the control registers (180) is comprised of a fuse element that is substantially similar to the memory technology used in programmable read only memories (PROMs) and known to those skilled in the art. This latch is programmed with the mode control bit of the present invention. This bit is referred to as TP BIT in subsequent figures.

In one embodiment, the mode control bit is programmed to a logical 0 to instruct the memory device to enter a low power mode. A logical 1 programs the device to a high throughput mode. Alternate embodiments use the opposite logic to invoke these modes. Still other embodiments use more than one bit in order to select from more than two different memory device modes.

Once the appropriate register or latch has been programmed with the desired state of the mode control bit, it is permanently programmed. Alternate embodiments of the mode control bit program the bit into a register or latch that can be cleared later and reprogrammed. This permits the mode of the memory device to be changed later.

The flash memory device illustrated in FIG. 1 has been simplified to facilitate a basic understanding of the features of the memory. A more detailed understanding of internal circuitry and functions of flash memories are known to those skilled in the art.

One embodiment of an implementation of the mode control programmable element of the present invention is illustrated in FIGS. 2 and 3. This embodiment varies the quantity of bits being programmed in order to vary the current consumption of the memory device. In a high throughput, higher power mode, the maximum quantity of bits is programmed at once. This mode has an increased current consumption due to programming a large number of bits simultaneously. In the lower power, low throughput mode, a reduced quantity of bits is programmed at once. In this mode, the programming rate is slowed down. This reduces the current consumption of the memory device. Alternate embodiments use other methods to adjust the current consumption/data throughput in response to the mode control bit.

The embodiment of FIG. 2 is comprised of two flip-flops (201 and 203) that generate four clocking signals. In one embodiment, the flip-flops (201 and 203) are D-type flip-flops. Other embodiments use other types of flip-flops.

The first flip-flop (201) is coupled to an originating clock signal. This clock signal can be generated from a circuit that is separate from the flash memory or the clock circuit may be incorporated into the flash memory circuitry. In one embodiment, the clock signal has a frequency of 5 MHz. This frequency is for illustration purposes only and does not limit the present invention to any one frequency.

The $\overline{Q}_0$ output of the first flip-flop (201) is fed back to its data input. The first flip-flop (201) generates a clock signal that is half the frequency of the originating clock signal. The $Q_0$ output of the first flip-flop (201) is input to the CLK input of the second flip-flop (203).

The $\overline{Q}_0$ output of the second flip-flop (203) is fed back to its data input. The second flip-flop (203) generates a clock signal that is one quarter of the frequency of the originating clock signal. The second flip flop then outputs a $Q_1$ signal and a $\overline{Q}_1$ signal.

The $Q_0$, $\overline{Q}_0$, $Q_1$, and $\overline{Q}_1$ signals of the flip-flop circuit are input to a logical AND/OR circuit to generate four data select signals (DATASEL0-DATASEL3). The DATASEL3 signal is generated by performing a logical AND operation (205 and 210) on the $Q_0$ and $Q_1$ signals. The output of this operation is then logically ORed (215 and 220) with the TP BIT to generate the DATASEL3 signal.

The $\overline{Q}_0$ and $Q_1$ signals are logically ANDed (206 and 211) and the output of the AND (206 and 211) operation is logically ORed (216 and 221) with TP BIT to generate the DATASEL2 signal. The $Q_0$ and $\overline{Q}_1$ signals are logically ANDed (207 and 212) and the output of the AND operation (207 and 212) is logically ORed (217 and 222) to generate the DATASEL1 signal. The DATASEL0 signal is generated by the logical ANDing (208 and 213) of the $\overline{Q}_0$ and $\overline{Q}_1$ signals with the subsequent OR operation (218 and 223) of the output of the AND (208 and 213) operation.

Figure 4:
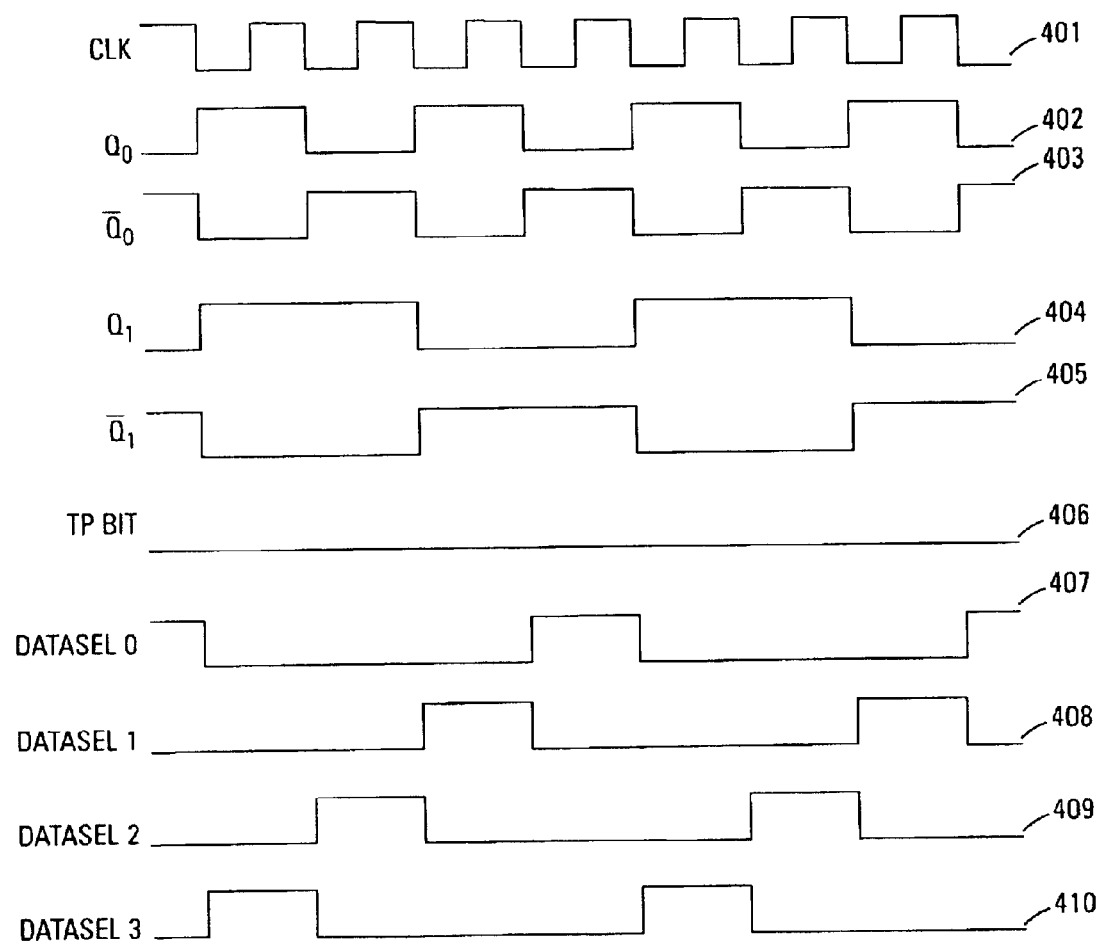
FIG. 4 shows a timing diagram in accordance with the embodiment of FIGS. 2 and 3.

The circuit of FIG. 2 shows that when the mode control bit is set to a logical high state to select the high data throughput mode, the data select signals (DATASEL0-DATASEL3) are always high. When the mode control bit (TP BIT) is set to a logical low state to select the low power mode, the data select signals (DATASEL0-DATASEL3) are high whenever the preceding AND operation is true. The timing diagram of this operation is illustrated in FIG. 4 and discussed subsequently.

FIG. 3 illustrates a logic diagram of a circuit that uses the data select signals (DATASEL0-DATASEL3) of FIG. 2. Depending on the state of the TP BIT, each data selection signal (DATASEL0-DATASEL3) selects a different 16-bit block of data to be loaded into a data driver (380).

The input data from a processor or other device is input to data latches (301). In the embodiment of FIG. 3, there are 64 data latches (301). Other embodiments use a different quantity of latches.

Each of the data select signals (DATASEL0-DATASEL 3) are input to a logical AND operation (305-320) for its assigned 16-bit data block. For example, DATASEL0 selects DATA0-DATA15, DATASEL1 selects DATA16-DATA31, DATASEL2 selects DATA32-DATA47, and DATASEL3 selects DATA48-63. For purposes of clarity, only the first and last logical AND operations (305-320) of each 16-bit data block are shown. It is obvious to those skilled in the art that there are an additional fourteen AND operations between these two AND operations (305-320).

When a 16-bit data block's respective data select signal is at a logical high, the data of that block from the data latches (301) is written to the data drivers (380). The data from the other 48 latches in the data drivers (380) will be 0 (the result of the logical AND operation of the data bit and the data select signal at 0). In a typical flash memory architecture, where a logic "0" is a programmed bit, the negative output of the data latch will be used. Therefore, a logic 0 in the data latch will give a physical "1" for the data driver signal if the related data select signal is high. A physical "1" in the data driver will bring the flash memory bit line high and the flash array cell will be programmed. Unselected data drivers will all be at 0 and no data will be programmed from unselected drivers.

As discussed subsequently with respect to FIG. 4, in the low power mode, each of the data select signals is only high for one clock cycle. During this clock cycle, the programming sequence for that data will be executed. Typically, a Write State Machine inside the control block (170) of FIG. 1, which controls all internal operations, will control the clock cycle. In the high data throughput mode, the data select signals are always high so that all 64 data bits are written simultaneously.

The data drivers (380) are included in write circuitry block (155). The output of the data drivers goes to the memory array as illustrated in FIG. 1. In the low power mode, each time 16-bits are asserted in the data drivers (380), a programming operation is executed resulting in the 16 bits being programmed into the memory array. In the high data throughput mode, each time the 64 bits are asserted in the data drivers (380), the programming operation is executed resulting in all 64 bits being programmed substantially simultaneously. The programming operation is known by those skilled in the art and is not discussed further.

The embodiment of FIGS. 2 and 3 is for illustration purposes only. Other embodiments may use different sizes of data blocks or a different total quantity of bits to be programmed, depending on the application. Still other embodiments use different methods for varying the current use by the memory device. For example, setting the mode control bit to a low power mode may increase the time between programming pulses such that data throughput is reduced.

FIG. 4 illustrates a timing diagram for the embodiment of FIGS. 2 and 3. As discussed previously with respect to FIG. 2, the originating clock signal (401) generates the $Q_0$ (402), $\overline{Q}_0$ (403), $Q_1$ (404), and $\overline{Q}_1$ (405) signals. The mode control signal (TP BIT) is shown as being at a logical low to select the low power mode.

The data select signals (407–410) are each high for one originating clock period. They are also high in a successive fashion so that only one data select signal (407–410) is high at any one time. In this way, each 16-bit data block of FIG. 3 is programmed separately from the other data blocks.

Figure 5:
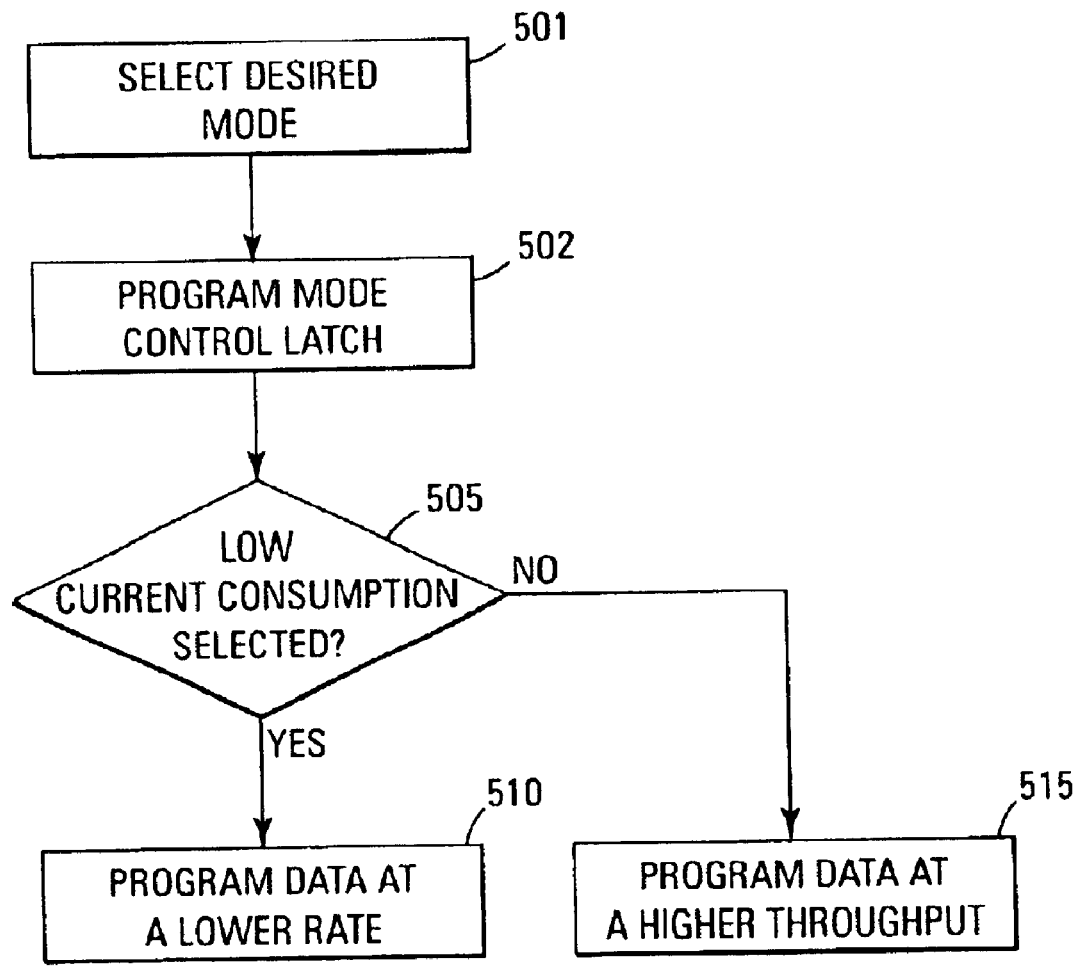
FIG. 5 shows flowchart of one embodiment of a power and throughput adjustment method of the present invention.

FIG. 5 illustrates a flowchart of one embodiment of a power and data throughput adjustment method of the present invention. The mode is selected (501) based on the application for the memory device. If the device is to be used in a battery-power device, low power operation would be desirable. If the device is to be used in a line power application, high data throughput may be chosen since current consumption is not typically a concern.

The selected mode is programmed into the mode control latch (502). If the low power mode was selected (505), data is programmed at a lower rate (510) so that less current is consumed during the programming operation. The lower rate is less than the maximum programming rate that would occur if all of the data latches were used substantially simultaneously. As described above, this may be in blocks of 16 bits or some other data block size. For example, two data select signals could be high simultaneously by using only $Q_0$ and $\overline{Q}_0$ outputs in the data select signal's generation.

If the high data throughput mode was selected (505), data is programmed at a higher data throughput (515). This rate is the maximum programming rate using all of the data latches.

In summary, a non-volatile memory bit is used to adjust the data throughput and, therefore, the power consumption of a memory device. A single memory device can be designed that can be used in either high-speed applications or low power applications by setting the mode control bit.

In one embodiment, the mode control bit selects a low power mode. This mode slows down the programming rate of the memory device, thus reducing the current requirements. In another embodiment, the mode control bit selects a high throughput mode. This mode programs the maximum quantity of bits substantially simultaneously. This mode requires a greater current draw than the low power mode with the reduced programming rate.

Numerous modifications and variations of the present invention are possible in light of the above teachings. It is therefore to be understood that within the scope of the appended claims, the invention may be practiced otherwise than as specifically described herein.

What is claimed is:

1. A memory device having an adjustable current consumption, the memory device comprising:
    a memory array for storing data input to the memory device during a low power mode; and
    a data register that stores a mode control bit, the adjustable current consumption being set to the low power mode in response to a state of the mode control bit.

2. The memory device of claim 1 wherein the data register is a non volatile memory register.

3. The memory device of claim 1 wherein the memory array is a flash memory array.

4. The memory device of claim 1 wherein the state of the mode control bit controls a rate of programming data into the memory array.

5. The memory device of claim 4 and further including write circuitry coupled to the memory array that controls the rate of programming data into the memory array in response to the state of the mode control bit.

6. The memory device of claim 1 wherein the low power mode has a reduced programming rate as compared to a high power mode.

7. A memory device having an adjustable data throughput, the memory device comprising:
    a memory array for storing data input to the memory device; and
    a data register that Stores a mode control bit, the adjustable data throughput being set in response to a state of the mode control bit.

8. The memory device of claim 7 and further including write circuitry coupled to the memory array that controls the rate of programming data into the memory array in response to the state of the mode control bit.

9. The memory device of claim 8 wherein the write circuitry comprises:
    a plurality of data latches that latch data input to the memory device; and
    a plurality of data drivers coupled to the plurality of data latches such that a data bit from a first data latch is coupled to a first data driver when enabled by a data select signal generated in response to the mode control bit.

10. A memory device having a high data throughput mode and a low power mode, the memory device comprising:
    a memory array for storing data input to the memory device; and
    a non-volatile memory location that stores a mode control bit, one of the high data throughput mode or the low power mode being selected in response to a state of the mode control bit.

11. The memory device of claim 10 wherein the non-volatile memory location is a fuse element.

12. A flash memory device having a high data throughput mode and a low power mode, the flash memory device comprising:
    a memory array for storing data input to the flash memory device;
    a non-volatile memory location that stores a mode control bit, one of the high data throughput mode or the low power mode being selected in response to a state of the mode control bit; and
    write circuitry that couples the input data to the memory array, the write circuitry varying a quantity of data being programmed to the memory array in a predetermined time in response to the selected mode.

13. The flash memory device of claim 12 wherein the write circuitry programs blocks of data to the memory array, each block of data having a predetermined size.

14. The flash memory device of claim 13 wherein a different block of data is programmed during each clock cycle of a clock coupled to the memory device.

15. A method for programming a memory device comprising:
    selecting a power mode of operation, from a plurality of different power modes of operation, based on an application for the memory device; and programming a latch in the memory device with an indication of the selected power mode of operation.

16. The method of claim 15 wherein the plurality of power modes of operation include a low power mode and a higher power, high data throughput mode.

17. The method of claim 15 wherein the programming comprises programming a fuse element with the indication of the mode of operation.

18. A method of operation of a memory device comprising:
   determining a mode of operation of the memory device, the mode of operation being programmed into a non-volatile latch of the memory device; and
   adjusting a data programming rate of the memory device in response to the mode of operation.

19. A method of operation of a memory device comprising:
   determining a mode of operation of the memory device, the mode of operation being programmed into a non-volatile latch of the memory device;
   if the mode of operation is for a low power consumption, programming data into the memory device at a first predetermined data rate that is less than a maximum data rate allowable by the memory device; and
   if the mode of operation is for high data throughput, programming data into the memory device at a second predetermined data rate that is greater than the first predetermined data rate.

20. An electronic system comprising:
   a processor that performs operational tasks of the electronic system; and
   a memory device, coupled to the processor, having a plurality of modes, the memory device comprising:
      a memory array for storing data input to the memory device; and
      a non-volatile memory location that stores a mode control bit, one of the plurality of modes being selected in response to a state of the mode control bit.

21. The electronic system of claim 20 wherein the processor is responsible for inputting data to the memory device.

22. The electronic system of claim 20 wherein the processor is responsible for programming data into the memory device.

23. The electronic system of claim 20 wherein the memory device is a flash memory.

24. An electronic system comprising:
   a processor that performs operational tasks of the electronic system; and
   a flash memory device having a high data throughput mode and a low power mode, the flash memory device comprising:
      a memory array for storing data input to the flash memory device;
      a non-volatile memory location that stores a mode control bit, one of the high data throughput mode or the low power mode being selected in response to a state of the mode control bit; and
      write circuitry that couples the input data to the memory array, the write circuitry varying a quantity of data being programmed to the memory array in a predetermined time in response to the selected mode.

25. The electronic system of claim 24 wherein the write circuitry comprises circuitry to program, in response to the selected mode, either blocks of data each having a predetermined quantity of bits or all programmable data bits.

26. The electronic system of claim 25 wherein, in the low power mode, the predetermined quantity of bits of each block of data is less than a maximum quantity of bits programmable into the memory device substantially simultaneously.

27. A memory device having an adjustable data throughput, the memory device comprising:
   a memory array for storing data input to the memory device; and
   a data register that stores a mode control bit, a rate of programming the memory array being controlled in response to a state of the mode control bit.

28. The memory device of claim 27 wherein the rate of programming is a low programming rate in response to the state of the mode control bit.

29. The memory device of claim 27 wherein the rate of programming is a high programming rate in response to the state of the mode control bit.

* * * * *